(12) United States Patent
Pirri et al.

(10) Patent No.: US 6,451,498 B1
(45) Date of Patent: Sep. 17, 2002

(54) PHOTOSENSITIVE COMPOSITION

(75) Inventors: Rosangela Pirri, Montardon; Francis Verzaro, Mallecouronne, both of (FR); Heinrich Meyer; Gonzalo Urrutia Desmasion, both of Berlin (DE); Gilles Meunier, Mazerolles (FR)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/544,309

(22) Filed: Apr. 6, 2000

Related U.S. Application Data

(63) Continuation-in-part of application No. 09/085,911, filed on May 28, 1998, now abandoned.

(51) Int. Cl.$^7$ ................................................ G03C 1/73
(52) U.S. Cl. .................................. 430/270.1; 430/910
(58) Field of Search .............................. 430/270.1, 910

(56) References Cited

U.S. PATENT DOCUMENTS

| | | | |
|---|---|---|---|
| 5,045,431 A | * 9/1991 | Allen et al. | 430/270.1 |
| 5,071,730 A | * 12/1991 | Allen et al. | 430/270.1 |
| 5,230,984 A | * 7/1993 | Tachiki et al. | 430/270.1 |
| 5,279,923 A | * 1/1994 | Hiro et al. | 430/270.1 |
| 5,372,912 A | * 12/1994 | Allen et al. | 430/270.1 |
| 5,374,500 A | * 12/1994 | Carpenter, Jr. et al. | 430/270.1 |
| 5,498,765 A | * 3/1996 | Carpenter, Jr. et al. | 430/323 |

\* cited by examiner

*Primary Examiner*—Janet Baxter
*Assistant Examiner*—Yvette M. Clarke
(74) *Attorney, Agent, or Firm*—Paul & Paul

(57) ABSTRACT

The invention relates to photosensitive compositions, which can be developed positively. Traditional compositions have either inadequate photosensitivity or they are not appropriate for use on the copper surfaces, for example of circuit boards, since the exposed coating sections of the composition cannot be completely removed during developing, which results in problems in subsequent plating or etching. In the photosensitive compositions according to the invention, these disadvantages cannot be observed. Various compositions are described, which contain photo acid generators and a polymer resin with side groups, which can split acid, said polymer resin being formed by polymerizing at least three different acrylate- or methacrylate-monomers.

10 Claims, No Drawings

PHOTOSENSITIVE COMPOSITION

CROSS-REFERENCE TO RELATED APPLICATION

This application is a continuation-in-part of U.S. Ser. No. 09/085,911 filed May 28, 1990 now abandoned.

BACKGROUND OF THE INVENTION

1. Field of the Invention

The invention relates to photosensitive compositions and their use as etching or galvano resist in the structuring of metal coatings on electrical circuit-substrates.

2. Brief Description of the Prior Art

In order to structure metal coatings, for example copper coatings on circuit board laminates, photosensitive lacquers or foils are used preferably, which cover the copper coatings during etching, so that the latter can be protected with respect to the etching solutions (Panel-Plating-Process, Print-and-Etch Process).

In this case these resists serve as etching protection. For this purpose, the circuit board surfaces or the laminates which serve as the circuit board inner coatings are coated with the resist film, then exposed with the conductive pattern, developed and the uncovered copper surfaces removed by etching. Subsequently the resist which is being used as an etching mask can be removed again.

In another type of method (Pattern-Plating-Process) the resists are applied, before the further metal application, on to the substrates which are to be coated (galvano resists) and then exposed with the conductive pattern and developed. After that, further metal can be deposited on to the uncovered copper surfaces.

In the past, in the construction of circuit conductor track structures, resist types were predominantly used which were developed after exposure with the metal structure about to be produced by means of organic solvents. In this process solvents, which besides water included esters, organic carbonates, ethers or acetates, were preferably used. Recently resist types have been introduced which can be developed by mean s of aqueous-alkaline solutions, since these developing solutions are easier to handle in effluent treatment. Moreover, they also offer advantages with respect to the protection of personnel since no volatile organic compounds, which are harmful to health, are contained in the solutions.

As a rule so-called negative resists are used, which are hardened by exposure so that after subsequent developing the resist regions, which were not exposed, can be removed. The disadvantage of negative resists lies in the fact that the protective effect of the resists only occurs after photo-hardening. For example, dust particles can prevent the photo-hardening during exposure at certain places, with the result that holes occur in the resist surface in these places during development. This susceptibility to error can be avoided by using larger resist coating thicknesses. Admittedly, the photographic resolution of the resist, for example, reduces then because of light scattering in the resist coating. Another possibility for avoiding the problem consists of increasing the purity of the ambient air. However this uses a lot of resources and is therefore costly. Therefore a certain proportion of circuit boards, which are produced with a negative resist, must be examined for error, possibly even within the manufacturing process after exposure and developing of the resist, in order to expose defects of this type.

Furthermore, negative resists for use in the Panel-Plating-Process are used only as foil and therefore protect the holes, which are contained in the circuit boards, against the copper etching solutions such that the resist foil covers the hole entrances (Tenting Process). An alternative type of method, in which the negative resist is deposited on to the hole walls directly and remains there for the protection of the copper coatings, even during the subsequent copper etching procedure, is by comparison not practicable, since the resist which is in the holes for this purpose would need to be exposed. This is however not possible on a reliable basis, particularly not in smallish holes with rough hole walls. In the Tenting Process it is essential that the resist foil regions which cover the holes, have an adequately large supporting area round the hole entrances for a copper ring to be placed round the hole entrances at these points even during subsequent etching, said copper ring however occupying unnecessary space on the circuit board.

When using a positive resist, in which the film, which is deposited on the surfaces about to be constructed, is at first insoluble in the developing solutions and only converted into a soluble state by exposure, the problems which have been mentioned exist to a far lesser extent.

In particular, it is possible by means of positive resists to metallize holes in circuit boards using the Panel-Plating-Process without residual rings being left round hole entrances. In this way considerably finer circuit patterns are made possible. Furthermore, it has emerged that, with positive resists, a better photographic resolution can be obtained by means of more precise definition of the structure edges.

The effect of negative and positive resists is depicted in greater detail in W. M. Moreau, Semiconductor Lithography, Plenum Press, 1988. Typical positive photoresists normally contain novolaks as polymers. For example, resists of this type are described in U.S. Pat. No. 5,266,440.

These photoresists are however not particularly light sensitive, so that long exposure times or high light intensities must be accepted. For example, in order to expose circuit boards which are coated with traditional positive resists, light intensities of about 350 mJ/cm$^2$ are required, while, when using negative resists, normally values of about 100 mJ/cm$^2$ suffice (c.f. Nakahara, Electronic Packaging & Production. 1992, pp. 66 ff).

In recent times positive resists are described, the photosensitivity of which depends on light-induced proton split-off in certain organic acids and consequent acid cleavage of side groups of the polymer consisting the resist generating soluble compounds in aqueous-alkaline solutions. The photosensitivity of these resist types is considerably higher that that of the previously mentioned types.

The principle of these resists described as in "Photoresiste mit chemischer Verstarkung" (Amplifikation-"chemically amplified photoresists") is described in G. M. Wallraff et al., "Designing tomorrow's photoresists", Chemtech, 1993, pp. 22 to 30. According to this, organic onium salts, for example, diphenyliodonium-hexafluoroantimonate are used as acid generators which are split by UV radiation. Polyacrylates are used preferably as acid-cleavable polymers, said polyacrylates containing tert.-butyl-groups as carbon acid ester side groups which are split off by acid catalysis. In this process polar carbon acid side groups emerge, which cause the higher solubility of the polymer in an aqueous solution.

In U.S. Pat. No. 4,491,628, a resist composition operating according to the previously mentioned principle is shown, said resist composition containing, as well as the acid generator, an acid-cleavable polymer. As a polymer, compounds with phenols or styrenes with tert-butylester-groups, for example poly-(tert-butoxycarbonyloxystyrene) are suggested. As acid generators, diaryliodonium- and triarylsulfonium-metal halogenides are used.

In EP O 445 058 A1 photoresists are described, which are catalyzed by acid cleavage and which, besides an acid generator, contain acid-cleavable polymers for example polystyrenes with tert-butoxycarbonyloxy groups. Organic onium salts for example aryldiazonium-, diaryliodonium-, and triarylsulfonium-metal halogenides are suggested as acid generators.

In EP O 568 827 A2, a pattern-forming composition is described which can also be deposited electrically and which, besides an acid generator, also contains polystyrenes as acid-cleavable polymers, namely phenolic resins, for example novolaks with tert-butoxycarbonyloxy-groups.

In U.S. Pat. No. 5,272,042 positive resists are described, which likewise contain polystyrenes with tert-butoxycarbonyl groups, as well as those which contain, as acid-cleavable polymers, polyacrylates with tert-butoxycarbonyl groups as side groups. N-hydroxyamides and N-hydroxyimides, for example N-trifluoromethyl sulfonyloxynaphthalimide are used as acid generators. In order to make the photoresist sensitive to visible light as well, an anthracene derivative is also used as a photosensitized for example 9,10-bis-(trimethylsilytethinyl)-anthracene.

In U.S. Pat. No. 5,071,730 a positive resist is likewise described which, besides an acid generator, (aryldiazonium-, diaryliodonium-, triarylsulfonium-metal halogenide), and photosensitizers (pyrene, perylene) contains an acid-cleavable polymer. A polyacrylate, which is formed from three different acrylates, namely tert-butylacrylate or tert-butylmethacrylate, methylacrylate or methylmethacrylate and acryl- or methacryl-acid is suggested as a polymer.

In U.S. Pat. No. 5,045,431 a composition is shown which is very similar to the previously mentioned resist, the polymer of which is formed likewise from acrylate compounds and contains ethylacrylate or butylacrylate as possible additional acrylate units in the polymer chain.

In U.S. Pat. No. 5,230,984 there is a resin composition, serving to form a depositable photoresist by means of electrophoresis, said resin composition consisting of acryl- or methacryl acid, also tert-alkylacrylate or tert-alkylmethacrylate and also a monomer which can be polymerized, the latter as a homopolymer having a glass transition temperature of 0° C. or lower. Among others, ethyl acrylate, propylacrylate, iso-butylacrylate and higher homologues are mentioned as monomers of this type. As photo acid generators, phosphonium-, sulphonium-, diazonium-, iodonium-salts and oxazole derivatives among others are suggested.

It has emerged, that the known positive resists, which are applied to the copper surfaces of circuit boards, cannot be removed from the copper surfaces without leaving residues during developing of the exposed regions. Even after an extended exposure time or increased light intensity during exposure, residues on the copper surfaces cannot be entirely removed, at least not when the resist film is treated during exposure within the parameters which are required for achieving a satisfactory exposure result (exposure time, light intensity). In particular, a resist coating lying directly on the copper surface during developing cannot be removed entirely and with assurance, so that, in the subsequent etching during the Panel Plating-Process or in the subsequent electrolytic plating Pattern-Plating-Process, problems arise. The residues which cannot be removed lead to defective adhesion of the subsequently deposited metal coating to the copper surfaces or to unsatisfactory etching results, since the residues impede the etching process. In a particularly unfortunate scenario, no further metal coatings at all are deposited in these places or the copper coating is not attacked at all in the etching process. Problems of this sort do not occur in the structuring of semiconductor substrates.

Furthermore, the contrast between exposed and unexposed places in traditional photoresists is only partly insufficiently small, with the result that the contour definition is not adequate. In addition, known resist coatings do not have sufficient resistance to chemicals, above all against acid etching solutions, since often a compromise between adequate ease of developing in alkaline solutions and resistance to chemicals must be found. Moreover, known resists also suffer from an increased susceptibility to the effects of dust and other impurities which are deposited on the resist coatings during exposure and thus prevent exposure. In positive resists, contaminations of this type normally lead to undeveloped places in the exposed regions, so that, in the production of circuit boards, metal deposition cannot proceed in these regions. In the production of semiconductor circuits this increased defect frequency does not play a highly significant part, since the procedure is done in any case in highly purified air. The highest requirements in the purity of the air during production of circuit boards cannot however be met.

The problem underlying the present invention resides thus in avoiding the disadvantages of the known methods and particularly in making available a resist composition, which can be removed from the copper surfaces, for example of a circuit board, without leaving any residues during developing, so that the further treatment steps can be carried out without any impairment caused by residues from the photo resist. Furthermore, it must also be guaranteed that the photo resist coating adheres sufficiently well to the copper surfaces. In particular, the unexposed resist coating which is not removed during the subsequent developing process must also withstand further chemical treatment steps without damage, must have a good contrast between exposed and unexposed areas and must be as unreceptive as possible to contamination during developing.

The problem is solved by the present invention.

SUMMARY OF THE INVENTION

The resist variations according to the invention, in addition to at least one photo acid generator, contain at least one polymer with acid-cleavable side groups, and which is converted into a soluble condition by the acid of the photo acid generator which released during exposure.

The polymer, preferably copolymer, is formed from various monomers, in order to achieve the object according to the invention. The polymer is formed from the following fractions of monomers relative to the polymer:

First Variant

A-Monomers, selected from the group of compounds acrylic acid and methacrylic acid, with a fraction of 8% by mol-% to 20% by mol-%.

B-Monomers selected from the group of compounds tert-butylacrylate and tert-butylmethacrylate with a fraction of 19% by mol-% to 70% by mol-% and C-Monomers selected from the group of compounds hydroxyethylmethacrylate, hydroxypropylmethacrylate, hydroxyphenylmethacrylate, hydroxyethylacrylate, hydroxypropylacrylate and hydroxyphenylacrylate with a fraction of 1% by mol-% to 30% by mol-%.

The acid-cleavable polymer can contain in addition to the previously mentioned monomers, D-Monomers selected from the group of compounds methylacrylate and methylmethacrylate with a fraction of 1 0% by mol to 60% by mol.

Moreover, the acid-cleavable polymer, can further contain in addition to the previously mentioned monomers A, B, C and D E-Monomers selected from the group of compounds with the general formula $$CH_2=CR^1-COOR^2,$$

where $R^1$ is a hydrogen atom or a methyl group and $R^2$ is a linear or branched alkyl group with at least three carbon atoms, with a fraction of 3% by mol to 35% by mol.

2nd Variant

A-Monomers selected from the group of compounds acrylic acid and methacrylic acid, with a fraction of 10% by mol to 25% by mol.

B-Monomers selected from the group of compounds tert-butylacrylate and tert-butylmethacrylate with a fraction of 17% by mol to 40% by mol.

D-Monomers, selected from the group of compounds methylacrylate and methylmethacrylate with a fraction of 20% by mol to 60% by mol and E-Monomers selected from the group of compounds with the general formula $$CH_2=CR^1-COOR^2,$$

where $R^1$ is a hydrogen atom or a methyl group and $R^2$ is a linear or branched alkyl group with at least five carbon atoms, with a fraction of 1% by mol to 35% by mol.

3rd Variant

A-Monomers selected from the group of compounds acrylic acid and methacrylic acid, with a fraction of 14% by mol to 20% by mol.

B-Monomers selected from the group of compounds tert-butylacrylate and tert-butylmethacrylate with a fraction of 20% by mol to 32% by mol.

D-Monomers, selected from the group of compounds methylacrylate and methylmethacrylate with a fraction of 30% by mol to 50% by mol and E-Monomers selected from the group of compounds with the general formula $$CH_2=CR^1-COOR^2,$$

where $R^1$ is a hydrogen atom or a methyl group and $R^2$ is a linear or branched alkyl group with two to four carbon atoms with a fraction of 10% by mol to 40% by mol 4th Variant A-Monomers selected from the group of compounds acrylic acid and methacrylic acid, with a fraction of 14% by mol to 19% by mol., B-Monomers selected from the group of compounds tert-butylacrylate and tert-butylmethacrylate with a fraction of 26% by mol to 40% by mol., D-Monomers, selected from the group of compounds methylacrylate and methylmethacrylate with a fraction of 40% by mol to 55% by mol. preferably from 50% by mol to 55% by mol.

5th Variant

A-Monomers selected from the group of compounds acrylic acid and methacrylic acid, with a fraction of 13% by mol to 15% by mol.

B-Monomers selected from the group of compounds tert-butylacrylate and tert-butylmethacrylate with a fraction of 22.5% by mol to 30% by mol.

D-Monomers, selected from the group of compounds methylacrylate and methylmethacrylate with a fraction of 50% by mol to 65% by mol.

DETAILED DESCRIPTION OF THE PREFERRED EMBODIMENTS

With the previously mentioned compositions, which include, besides the photo acid generator, at least one of the described polymers, photoresists are obtained with the following characteristics:

a. In an exposed state, the resist coating can be removed with no problem from the underlying copper coating by using developing solutions. No residues remain on the copper surface. Since the polymer contains tert-butylacrylate and/or tert-butylmethacrylate, the solubility of the resist coating increases in aqueous developing solutions during exposure.

b. In the unexposed state the resists withstand the treating solutions which are normally used in an electroplating process. In particular the resist coating has a high adhesion to the copper coating of a circuit board. Because of the carbon acid proportion in the polymer, namely the proportion of acrylic acid and methacrylic acid, the adhesion of the resist on to the copper surface increases, by means of which the danger of chemicals undercutting the resist coating is reduced. On the other hand, the solubility of the resist in aqueous developing solutions is reduced when the proportion of carbon acid in the polymer is reduced.

By using hydrophobic monomer components in the monomer, which contain at least three carbon atoms in the side chain of the acrylate according to the 1st polymer variant, the resistance of the unexposed composition to chemical treating medium (aqueous treating solutions with pH values of 0 to 13) is increased. The same adaptation of the exposed and unexposed regions in the photoresist according to the invention can furthermore be achieved by adjusting the balance between the content of hydrophilic and hydrophobic components (also side chains with at least two carbon atoms) in the polymer with further monomers. By means of the polymers according to the invention, an increased contrast of the resists during exposure is achieved and also an exceptionally high chemical resistance of the developed coatings. For example, a developed coating of the resist according to the invention on a circuit board covered with a copper lamination can even withstand being situated for several hours in a hydrochloric acid/copper-(II)-chloride solution which is normally used for etching copper. Admittedly, undercuts are formed in this situation on the flanks of the developed structures, which result from sideways corrosion from the etching medium on to the copper lamination. However, the resist coating adheres moreover to the copper lamination without defect.

c. In addition, a substantially smaller defect rate is attained than with traditional resists, said defect rate being caused by dust contamination and other impurities on the resist surface during developing.

d. Furthermore, the unexposed resist coating can be removed again from the substrate surface by appropriate solutions (strippers).

e. The resists have a high light sensitivity. The polymers according to the invention furthermore have the advantage of a high transparency, with the result that light in the resist coating is only scattered a little. For this reason, a high contour definition is achieved during exposure and subsequent developing, which leads to outstanding definition and excellent photographic resolution capability. The contrast increases with the proportion of tert-butylacrylate or tert-butylmethacrylate during development of the resist.

f. By means of appropriate composition of the polymer from certain monomers, it is possible to make polymers with an appropriate glass transition temperature $T_g$ between 40° C. and 150° C. Since the photosensitive composition according to the invention is heated during the application process on the surfaces about to be structured, the resulting coatings can be formed by partial softening as uniformly thick films, which are free of air bubbles, inclusions or other interfering impurities. Moreover, by means of a glass temperature in the given range, a resist coating is made possible which is mechanically capable of resistance in a cold state and which is flexible in a warm state.

The glass transition temperatures of the resist coatings lying within the given range further make possible an unproblematic transfer of the resist coatings, which are deposited on polymer carrier films, on to the substrate surface for use as dry resists. Too low a glass transition temperature would lead further to the composition delivering unusable images. Too high a temperature would lead to greater strength of the resist coating and also to very high transfer temperatures (transfer of the resist coating from a carrier on to the substrate) and glazing temperatures.

g. The resist coatings formed from the compositions according to the invention can be developed with aqueous-alkaline solutions or completely removed. Organic solvents are not required, in particular no chlorinated hydrocarbons.

The photosensitive polymers have average molecular weight $M_w$ of 30,000 to 90,000, preferably 35,000 to 82,000.

The molecular weight distribution of the polymers can be described by a poly-molecularity index PI, which gives the ratio of the average molecular weight $M_w$ of the polymer to the number average of the molecular weight $M_n$. The poly-molecularity index PI describes the range of the molecular weight distribution (cf. also for this M. Hoffmann, H. Kroner, R. Kuhn in Polymeranalytik I, p. 34, G. Thieme Verlag, Deutschland, 1977). The poly-molecularity index PI of the polymers according to the invention has a value of 1.6 to 3.1, preferably 2.1 to 3.0.

These characteristics are influenced by a large number of reaction parameters, for example by the choice of solvent, the choice of reaction temperature and the type of reaction initiator (for example of the peroxide compound) in the polymerization of monomer mixtures according to the invention. An indication of the mechanism for controlling the poly-molecularity index PI is given in H. G. Glas, Makromoleküle, p. 487, Hüthig-Verlag, Deutschland, 1990. Small values for poly-molecularity index PI reflect a narrow molecular weight distribution. The normal compounds may be used as photo acid generators, for example N-trifluoromethylsulfonyloxynaphthalimide (NIT)

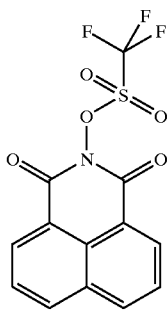

and other trifluoromethylsulfonyloxyimide derivatives such as

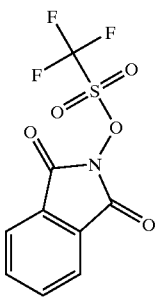

further, trifluoromethylsulphonyloxy-bicyclo[2.2.1]-hept-5-en-2,3-dicarboximide (MDT), naphthoquinone-1,2-diazide-4-sulphonic acid ester, for example, 1naphthalinesulphonic acid-3-diazo-3,4-dihydro-4-oxoester with phenyl-(2,3,4-trihydroxypheny)-methanone. Further N-trifluormethylsulfonyloxyimide derivatives are given in J. M. J. Fréchet, Pure and Appl. Chem., 64, pp. 1239-1248 also in U.S. Pat. No. 5,272,042, for example,

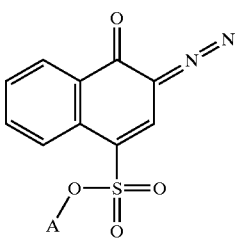

DNQ, with A=aromatic residue and

DNQ-P

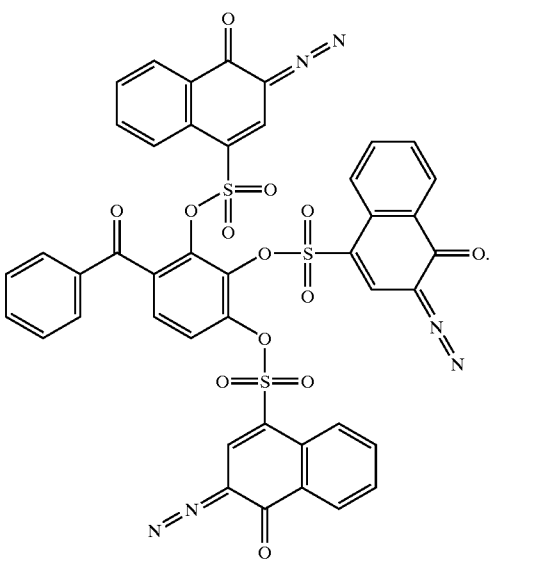

Furthermore, 1,2,3-benzene-tris-(sulphonic acid trifluoromethylester), 1,2,3-benzene-tris-(sulphonic acid methylester),6,7-bis-(trifluoromethylsulphonyloxy) coumarin, 2,3,4-tris-(fiuoromethylsulphonyloxy)-benzophenone are suitable as photo acid generators as well as those photo acid generators described in EP-A 0 489 560.

The synthesis of photo acid generators is amongst others described in EP-A 0 058 638 as well as in J. M. J. Fréchet, Pure and Appl. Chem., 64, pp. 1239 to 1248.

The content of photo acid generators in the photosensitive composition is 1% by weight to 25% by weight, preferably 2% by weight to 20% by weight, relating to the weight of the polymer in the composition.

In the photosensitive composition, further components are included besides the photo acid generators and the polymer:

In order to also make the composition sensitive to light with a certain spectral distribution of intensity, preferably in the visible range (330 nm to 440 nm) one or a plurality of photo sensitizers are added to the composition. The main concern here is polycyclic aromatic compounds for example anthracene, 9-anthracene methanol, 1,4-dimethoxyanthracene, 9,10-diethylanthracene, 9-phenoxymethylanthracene and 9,10-bis-(ethinyl)-anthrancenes, such for example as 9,10-bis-(trimethylsilylethinyl)anthracene, by means of which the light sensitivity of the photosensitive compositions, preferably to red light, is greatly increased.

These photosensitizers are used preferably in concentrations of 1% by weight to 6% by weight, preferably of 2% by weight to 4% by weight, relating to the weight of the polymer in the composition.

Furthermore, the compositions according to the invention can also contain dyes, to improve the perceptibility of the resist, even in a thin coating on the substrate which is about to be structured, and also contain further components which are normal for photoresist materials.

The compositions which can be used as resists are used for example as liquid formulations. For this purpose, they are mixed with appropriate solvents, for example ethers, ether alcohols or ether esters. For example, propylene glycol monomethylether acetate, 1-methoxy-2-propanol, ethyl lactate, 3-ethoxypropionate. ethylene glycol monoethyl ether acetate, methoxybutanol, diethylene glycol monoalkylether and propylene glycol monobutylether are used as solvents.

The liquid composition is deposited on the surfaces which are to be coated for example by spinning-on (Spin-coating). Another deposition technique is the roller coating procedure in which the composition first of all moistens a first roller with a thin coating, the liquid being deposited by means of wringers on to the roller at a defined thickness. From this roller the coating is conveyed next, through direct contact of the roller with the substrate on to the latter. In this way, a uniformly thick film can also be formed on large-surface flat substrate surfaces. Normally coating thicknesses of the composition of 3 μm to 20 μm are used.

The roller coating procedure has the advantage that unproblematically defined coating thicknesses of the resist can be used on plate-shaped substrates, for example circuit boards. Moreover, the substrates can be conveyed in a horizontal position and direction through the coating unit. Coating units of this type can be connected furthermore with other horizontal units for the further treatment steps in producing the metal structures with the result that the substrates can be handled more easily with the possibility of automation.

Furthermore, the liquid composition can be deposited on the substrate also by submerging it. There is a problem however here in that coating thicknesses are set which are variable and not controllable at the edges.

The compositions according to the invention can be deposited however, for use in the dry film technique also, on to a polymer carrier film, for example on to a polyester foil. From the latter, the composition can be conveyed by direct contact of the photosensitive coating, which is deposited on the foil, to the substrate which is to be structured, for example by pressing.

After coating the substrate with the composition, the resist coating which is formed is dried by the effect of heat, for example in a forced-air oven or by means of infra-red radiation. After that, the coating is coated with the template, then heated again to accelerate the formation of the latent pattern (Reheating), and subsequently the coated regions in the resist coating are dissolved away during developing. For this purpose spraying units are used preferably, by means of which the developing solution is sprayed on to the substrate surfaces via jets. Aqueous-alkaline solutions are preferably used as developing solutions, for example sodium carbonate solution.

The photosensitive compositions can be used as etching or galvanoresists for making metal coatings, for example for producing electrical circuit carriers. The further processes for producing the desired metal structures endorse the mentioned procedural steps, for example etching processes or further electrolytic metal deposition procedures, in which, in the resist channels which are formed, the uncovered metal surfaces are removed by etching processes or are constructed further by means of electrolytic deposition procedures.

A further use of the photosensitive compositions resides in their use as a galvanoresist in the additive process, preferably for the photo-structuring of substrates from epoxy resins, acrylonitrile-butadiene-styrene-copolymers (ABS) and polyimide. Metal structures are thus produced by means of electroless plating baths in the resist channels, which are formed by exposure and developing.

After completion of the structuring method the resist coating is removed again from the substrate surfaces preferably by means of aqueous-alkaline solutions, for example a caustic soda solution.

The compositions according to the invention are used for making metal coatings on electric circuit carriers, for example on epoxy resin-, polyimide-laminates or their composites as well as for decorative purposes on metal and plastic material substrates. In a preferred application, the compositions are used for producing circuit boards provided with copper surfaces and inner layer laminates to be used for circuit boards.

The following examples serve to explain the invention:

EXAMPLE 1
(Polymer Synthesis for Producing a Dry Substance)

In order to produce the acrylate polymers according to the invention, tetrahydrofuran (THF) and azo-bis-isobutyronitrile (AIBN) were first placed in a double-necked flask. Then the monomers were added. The reaction mixture was kept hermetically sealed during the entire duration of the reaction. The ratios of the amounts used for producing a polymer according to the invention are given in the following table

| Component | Quantity in parts by weight |
|---|---|
| THF | 1467 |
| AIBN | 1.956 |
| methacrylic acid | 64.2 |
| tert-butylmethacrylate | 128.4 |
| methylmethacrylate | 128.4 |
| butylacrylate | 134.7 |
| hydroxypropylmethacrylate | 33.3 |

At the start of the polymerization reaction the mixture was heated. The mixture was refluxed for 24 hours, the conversion was 100% after the reaction was finished.

After completion of the reaction the polymer was precipitated with petroleum benzene. After separation, a colourless powder was obtained, which was dried in a vacuum for 48 hours at 60° C. to 70° C.

The polymers given in Table 1 were also produced, furthermore, using the presently described method.

EXAMPLE 2
(Polymer Synthesis for the Direct Use of the Reaction Solution as Photoresist Base)

The procedure was as in Example 1. However propylene glycol monomethylether acetate (PGMEA) was used as solution medium instead of THF. The following ratios of the amounts of individual components were used to produce the polymer.

| Component | Quantity in parts by weight |
| --- | --- |
| PGMEA | 485 |
| AIBN | 0.652 |
| methacrylic acid | 21.4 |
| tert-butylmethacrylate | 42.8 |
| methylmethacrylate | 42.8 |
| butylacrylate | 44.9 |
| hydroxypropylmethacrylate | 11.1 |

At the start of the polymerization reaction the mixture was heated to 100° C. The mixture was heated for 26 hours, the conversion was 100%. A polymer with the same composition as the polymer produced using the method according to Example 1 was obtained. The polymers given in Table 1 were also produced, using the presently described method.

Instead of the solvents used in Examples 1 and 2, in polymerization, dioxane, cyclohexanone or heptane were used as solvents. Instead of azo-bis-isobutyronitrile (AIBN), benzoyl-peroxide or other radical initiators can be used. The completeness of the reaction is thus dependent on the solvent used, on the reaction temperature, on the type of initiator and the duration of the reaction.

EXAMPLE 3
(Production of a Liquid Photoresist Composition, Photosensitive Resist)

In the yellow-light area 30 parts by weight N-trifluoromethylsulfonyloxynaphthalimide (NIT) as acid generator and 20 parts by weight 9-anthracenemethanol (AM) as sensitizer were mixed with 1000 parts by weight of a solution of polymer, obtained according to Example 1 in propylene glycol monomethylether acetate, with a solution having a solids content of approx. 25% by weight (20 to 30% by weight).

In another embodiment, a polymer solution with 20% by weight and 30% by weight, resp., was used instead of a polymer solution with 25% by weight.

In a further experiment, 200 parts by weight 4-diazonaphthoquinone sulphonic acid ester was used instead of NIT and AM.

Furthermore, appropriate polymer solutions, which were obtained by dissolving the polymer dry substance, obtained according to Example 1, in 1-methoxy-2-propanol with the same solids contents, were used to produce the liquid photopolymer compositions.

EXAMPLE 4
(Use of the Photoresist Composition According to Example 3 for Structuring Circuit Boards)

A circuit board base material was used which was made by the company Allied Signal Norplex Oak, USA with the type designation ED 130, which had on both sides a 18 μm thick copper laminate (corresponding to the US Military specification MIL S 13949). The base material was treated according to the following procedure:

| | | | |
| --- | --- | --- | --- |
| 1. Pre-treatment: | a- etch cleaning with Scheretch M (Product of company Atotech Deutschland GmbH, Berlin. DE) | 20–25° C. |
| | b- Rinsing with water | 25° C. |
| | c- Pickling with $H_2SO_4$ | 25° C. |
| | d- Rinsing with water | 25° C. |
| | e- compressed-air drying | |
| | f- drying in circulated-air oven (5 min) | 80° C. |
| 2. Coating: | Spin Coating spun-on layer thickness: 2.5 μm to 4.5 μm | |
| 3. Drying: | On the heater plate (2 min) | 100° C. |
| | or in circulated-air oven (5 min) | 80° C. or 100° C. |
| 4. Exposure | Exposer of company FSL, United Kingdom, Type T 5000 Wavelength 365 nm (i-line) Light intensity 20 rnJ/cm$^2$ to 60 mJ/cm$^2$ Layout: resolution line test mask No. 31 of company Haidenhain, Germany | |
| 5. Reheating | On heater plate or in circulated-air oven 3 min to 20 min | 80–120° C. |
| 6. Developing: | In a spray installation with a 1% by weight $Na_2CO_3$-solution (1 min to 3 min) | 30° C. |
| 7. Copper Etching: | Acidic iron-(111)-chloride etching solution (105 sec to 3 min) | 40° C. |
| 8. Layer Removal: | In a spray installation with a 1.8% by weight NaOH solution | 55° C. |

While using a resist produced according to Example 3 with polymer compositions given in Table 1, a photographic resolution according to table 2 was achieved. In the channels in the photoresist structure, which resulted after developing, no residues could be seen. After etching the uncovered copper surfaces (procedural step 7.) and after the subsequent removal of the resist coating (procedural step 8.), a copper template with highly resolved structures was obtained.

EXAMPLE 5

The same result was achieved with resists with compositions according to Table 1, which were produced from the reaction solution according to Example 2. For this purpose a polymer solution was produced respectively according to Example 2 and mixed according to Example 3 with NIT and AM to form a photoresist composition.

Under the conditions of the procedure according to example 4, in which the exposed resist coating was reheated for 20 minutes at 80° C., a very good photographic resolution of the structures which were formed was likewise obtained. After developing, there were no resist residues left in the channels.

Comparative Test V1

With a polymer of the composition
17.6% by mol methacrylic acid, A
21.4% by mol tert-butylmethacrylate, B
61% by mol methylmethacrylate C
a liquid photoresist composition was produced with 30 parts by weight NIT and 20 parts by weight AM respectively per 1000 parts by weight of polymer solution being dissolved in a 25% by weight polymer solution in propylene glycol monomethyl ether.

The photoresist was deposited on a circuit board base material using the procedure according to Example 4 and structured. After developing, a continuous thin resist coating was found in the resist channels. For that reason, the underlying copper could not be or only very imperfectly be removed by the etching solution.

This firmly adhering resist film could be penetrated at least partly only after extending the developing time, using a stronger concentration of developing solution, increasing the developing temperature or with a combination of these measures. However the etching result was unsatisfactory even in this situation, since the etching solution could not corrode the copper without hindrance because of the parts of the resist coatings which were left behind. Moreover, the copper surfaces in the resist channels were partly passivated by the more intensive corrosion of the developing solution with the result that the copper surfaces were also for that reason harder to etch.

The test was repeated with polymers having the following compositions:

1. 2.1% by mol acrylic acid,
   30.7% by mol tert-butylmethacrylate,
   33.6% by mol methylmethacrylate,
   33.6% by mol ethylacrylate;
2. 20.5% by mol methacrylic acid,
   31.0% by mol tert-butylmethacrylate,
   48.5% by mol methylmethacrylate.

In those cases there were no sufficiently good results obtained while developing the resist coatings: it emerged that residues of the resist were left behind in the resist channels and that said resists could not be completely removed during development.

EXAMPLE 6
(Roller Deposition Method for the Photoresist)

By means of a roller deposition device, liquid photoresist compositions, which were produced according to Example 3, from the polymers C, J and P (also see table 1), were applied to the copper surfaces of circuit board base material blanks (25 cm×37. 5 cm).

For this purpose 1.5 mm thick FR 4-plates from the Circuit-Foil Company, USA and 1.0 mm thick plates from the Fukada Company, Japan were used. Both types had I 17.5 μm thick copper laminations on both sides.

The procedure for treating circuit boards is shown in the following:

| 1. Pre-treatment: | a- etch cleaning with a solution of $Na_2S_2O_8$ and $H_2SO_4$ (0.5 min) | 25° C. |
| --- | --- | --- |
| | b- Rinsing with water (0.5 min) | 25° C. |
| | c- drying in air (ca. 1 min) | |
| 2. Coating: | Roller coating or Spin Coating layer thickness 4 μm to 6 μm | |
| 3. Drying: | In circulated-air oven (5 min) | 100° C. |
| 4. Exposure: | Exposer of company Tamarack, wavelength 365 nm (i-line) Light intensity 10 mJ/cm² to 150 mJ/cm² | |
| 5. Reheating: | In circulated-air oven 5 min to 20 min | 80–120° C. |
| 6. Developing: | In a spray installation with a 1% by weight $Na_2CO_3$ solution (2 min) | 30° C. |
| 7. Copper Etching: | a- acidic copper-(II)-chloride etching solution (70 sec) b- acidic rinsing c- rinsing with water (0.5 min) | 50° C. |
| 8. Layer Removal: | In a spray installation with a 1.8% by weight NaOH-solution (1.5 min) | 55° C. |

The results shown in Table 3 were obtained. Highly resolved structures were attained after developing the resist. In the resist channels there were no residues of the resist left behind.

Comparative Test V2

The test from Example 6 was repeated. Instead of the resists used there however, resists from comparative Test V1 were used with a polymer formed from 17.6% by mol methacryl acid,
21.4% by mol tert-butylmethacrylate,
61.0% by mol methylmethacrylate, In Table 4, the test conditions are given.

No acceptable results could be obtained. In the resist channels, produced during development, there were still resist residues left, which, even with a more intensive development process, could not be removed.

EXAMPLE 7
(Additive Technique)

A photoresist combination, according to the invention, formed from 20% by weight of the polymer J, 0.6% by weight N-trifluoromethylsulfonyloxynaphthalimide (NIT) as an acid generator and 0.4% by weight 9-anthracene methanol (AM) as photosensitizer in propylene glycol monomethylether acetate was spun on to a plastic part made from acrylonitrile-butadiene-styrene-copolymer (ABS) which had previously been treated with a chrome/sulphuric acid pickling solution, then activated with an activator (Noviganth® AK 1 from the company Atotech Deutschland GmbH) and fixed with the solution Noviganth® AK II from the company Atotech Deutschland GmbH. The photocomposition was alternatively applied also on to the ABS-part using a roller coating technique. The thickness of the resist coating lay between 3 μm to 20 μm.

Next the resist coating was exposed through a photomask with a light intensity of 71 mJ/cm² to 94 mJ/cm² and after that reheated in a forced air oven for 10 minutes at a temperature of 100° C. The sample part was developed with a 1% by weight $Na_2CO_3$ solution at 30° C.

In the 100 μm wide structures in the resist coating, a nickel coating was deposited from an electroless nickel bath (Noviganth® TC from the company Atotech Deutschland GmbH) on to the palladium germs formed with the Noviganth® activator in the space of 3 to 4 minutes at 45° C. to 50°. A tin-lead alloy coating was further deposited electrolytically within 5 to 6 minutes at 35° C on the nickel coating (Sulfolyt® TC from the company Atotech Deutschland GmbH).

Subsequently, the resist coating was again removed completely from the ABS part by means of a 5% by weight potassium hydroxide solution. In order to accelerate the removal of the coating, butyldiglycol was added to the potassium hydroxide solution.

TABLE 1

| Test | 1.Comp.(A) [Mol-%] | 2.Comp.(B) [Mol-%] | 3.Comp.(D) [Mol-%] | 4.Comp.(E) [Mol-%] | 5.Comp.(C) [Mol-%] | $T_g$ [°C.] | $M_n$ [g/mol] | $M_w$ [g/mol] | PI |
|---|---|---|---|---|---|---|---|---|---|
| A | 14.2(MAA) | 23.6(TBMA) | 62.2(MMA) | — | — | 150 | 23.900 | 50.000 | 2.1 |
| B | 17.6(MAA) | 21.4(TBMA) | 30.5(MMA) | 30.5(BA) | — | 116 | 22.000 | 52.700 | 2.4 |
| C | 17.6(MAA) | 21.4(TBMA) | 50.0(MMA) | 11(2EHA) | — | 122.1 | 28.600 | 63.400 | 2.2 |
| D | 17.6(MAA) | 21.4(TBMA) | 41.0(MMA) | 20(ANON) | — | 109.9 | 30.000 | 63.900 | 2.1 |
| E | 14(MAA) | 24(TBMA) | 41(MMA) | 20(BA) | — | 40 | 15.800 | 34.700 | 2.2 |
| F | 14(MAA) | 24(TBMA) | 41(MMA) | 21(BA) | — | | 18.630 | 56.920 | 3.1 |
| G | 18(MAA) | 22.9(TBMA) | 39.1(MMA) | 20(BA) | — | | 22.880 | 67.130 | 3.0 |
| H | 17.6(MAA) | 21.4(TBMA) | 50.0(MMA) | — | 11.0(HPMA) | 145.8 | 33.700 | 82.600 | 2.4 |
| J | 17.6(MAA) | 21.4(TBMA) | 30.5(MMA) | 25(BA) | 5.5(HPMA) | 98.5 | 22.300 | 60.500 | 2.7 |

| Test | 1.Comp.(A) [Mol-%] | 2.Comp.(B) [Mol-%] | 3.Comp.(D) [Mol-%] | 4.Comp.(E) [Mol-%] | 5.Comp.(C) [Mol-%] | $T_g$ [°C.] | $M_n$ [g/mol] | $M_w$ [g/mol] | PI¶ |
|---|---|---|---|---|---|---|---|---|---|
| K | 17.6(MAA) | 21.4(TBMA) | 30.5(MMA) | 25(BA) | 5.5(HEMA) | | | | |
| L | 17.0(MAA) | 20.8(TBMA) | 29.9(MMA) | 24.4(BA) | 8.0(HPMA) | | | | |
| M | 19.0(MAA) | 21.0(TBMA) | 30.1(MMA) | 24.7(BA) | 5.2(HPMA) | | | | |
| N | 17.6(MAA) | 31.9(TBMA) | 30.5(MMA) | 20.0(BA) | — | 110.5 | 24.500 | 56.000 | 2.3 |
| O | 17.6(MAA) | 31.4(TBA) | 51.0(MMA) | — | — | 118.9 | 21.000 | 53.200 | 2.5 |
| P | 17.6(MAA) | 21.4(TBMA) | 30.5(MMA) | 30.5(BA) | — | 92 | | | |

MAA: methacrylic acid
BA: butyl acrylate
HPMA: hydroxypropylmethacrylate
TBMA. tert-butylmethacrylic acid
2EHA: 2-ethylhexylacrylate
ANON: nonylacrylate
MMA: methylmethacrylate

TABLE 2

(Photographic resolution after development of the photoresist layers spun on lay spin coating): The optical resolution values were obtained on test samples with a line/interspace ratio of 1:1.

| Test | Exposure Energy Density [mJ/cm] | Reheating Temp. [C] | Reheating Trtmt.time [min] | Development Trtmt.time [min] | Photographic Resolution [μm] |
|---|---|---|---|---|---|
| Resist A: | | | | | |
| A1 | 20 | 120 | 3 | 1 | 25 |
| A3 | 20 | 110 | 10 | 1 | 32 |
| A4 | 40 | 110 | 10 | 1 | 32 |
| A6 | 21 | 80 | 20 | 2 | 20 |
| Resist B: | | | | | |
| B1 | 20 | 110 | 10 | 1 | 32 |
| B2 | 20 | 110 | 10 | 3 | 32 |
| B3 | 40 | 110 | 10 | 1 | 32 |
| B4 | 38 | 80 | 20 | 2 | 25 |
| Resist C: | | | | | |
| C2 | 40 | 110 | 10 | 1 | 16 |
| C4 | 40 | 80 | 20 | 2 | 20 |
| Resist D: | | | | | |
| D1 | 20 | 110 | 10 | 1 | 20 |
| D2 | 20 | 110 | 10 | 3 | 32 |
| D3 | 40 | 110 | 10 | 1 | 32 |
| Resist E: | | | | | |
| E1 | 40 | 100 | 5 | 1 | 40 |
| E2 | 38 | 80 | 20 | 2 | 16 |
| E3 | 19 | 80 | 20 | 2 | 12 |
| E4 | 19 | 90 | 10 | 2 | 16 |
| Resist F: | | | | | |
| F1 | 16 | 80 | 20 | 2.5 | 25 |
| F2 | 30 | 80 | 20 | 2.5 | 32 |
| Resist G: | | | | | |
| G1 | 16 | 80 | 20 | 2.5 | 25 |
| G2 | 30 | 80 | 20 | 2.5 | 40 |
| Resist H: | | | | | |
| H | 21 | 110 | 5 | 1 | 20 |
| Resist J: | | | | | |
| J1 | 21 | 110 | 10 | 1 | 10 |
| J2 | 21 | 110 | 10 | 3 | 16 |
| J3 | 40 | 110 | 10 | 1 | 16 |
| J4 | 40 | 110 | 10 | 3 | 20 |
| Resist K: | | | | | |
| K1 | 16 | 80 | 20 | 2.5 | 20 |
| K2 | 30 | 80 | 20 | 2.5 | 32 |
| K3 | 40 | 80 | 20 | 2.5 | 40 |
| Resist L: | | | | | |
| L1 | 30 | 80 | 20 | 2.5 | 25 |
| L2 | 40 | 80 | 20 | 2.5 | 40 |
| Resist M: | | | | | |
| M1 | 16 | 80 | 20 | 2.5 | 60 |
| M2 | 30 | 80 | 20 | 2.5 | 20 |
| Resist N: | | | | | |
| N1 | 20 | 110 | 10 | 1 | 12 |
| N2 | 20 | 110 | 10 | 3 | 12 |
| N3 | 40 | 110 | 10 | 1 | 12 |
| N4 | 40 | 110 | 10 | 3 | 32 |

TABLE 2-continued (Photographic resolution after development of the photoresist layers spun on lay spin coating): The optical resolution values were obtained on test samples with a line/interspace ratio of 1:1.

| Test | Exposure Energy Density [mJ/cm] | Reheating Temp. [C] | Reheating Trtmt.time [min] | Development Trtmt.time [min] | Photographic Resolution [µm] |
|---|---|---|---|---|---|
| N5 | 40 | 100 | 5 | 1 | 10 |
| N6 | 40 | 80 | 20 | 2.5 | 32 |
| Resist O: | | | | | |
| O | 20 | 110 | 1 | 1 | 16 |

TABLE 3

(Photographic resolution after development of the photoresist layers applied by means of the roller coating method):

| Test | Exposure Energy density [mJ/cm²] | Reheating Temp. [° C.] | Reheating Trtmt.time [min] | Photographic Resolution [µm] |
|---|---|---|---|---|
| Resist C: | | | | |
| C1 | 95 | 80 | 20 | 20 |
| C2 | 18 | 100 | 10 | 8 |
| C3 | 37 | 100 | 10 | 12 |
| C4 | 55 | 100 | 10 | 20 |
| C5 | 18 | 100 | 20 | 10 |
| C6 | 37 | 100 | 20 | 16 |
| Resist J: | | | | |
| J1 | 37 | 80 | 10 | 6.3 |
| J2 | 55 | 80 | 10 | 6.3 |
| J3 | 37 | 80 | 20 | 12 |
| J4 | 55 | 80 | 20 | 16 |
| J5 | 9 | 100 | 5 | 4 |
| J6 | 18 | 100 | 5 | 6.3 |
| J7 | 37 | 100 | 5 | 10 |
| J8 | 55 | 100 | 5 | 12 |
| J9 | 94 | 100 | 5 | 16 |
| Resist P: | | | | |
| P1 | 55 | 80 | 20 | 3 |
| P2 | 37 | 100 | 10 | 4 |
| P3 | 55 | 100 | 10 | 6 |
| P4 | 37 | 100 | 20 | 6 |

TABLE 4

(Photographic resolution after development of the photoresist layers according to Comparative Test V2, applied by the roller coating method):

| Test | Exposure Energy density [mJ/cm²] | Reheating Temp. [° C.] | Reheating Trtmt.time [min] | Photographic Resolution [µm] |
|---|---|---|---|---|
| I | 37 | 80 | 20 | no image |
| II | 55 | 100 | 10 | 6.3/not etchable |
| III | 147 | 100 | 20 | 16/not etchable |

Comparative Example V3

Further compositions have been prepared under the conditions given under Comparative Example V1. The compositions of components A, B, C, D and E are given in Table 5.

The photoresists were then applied to printed circuit board material using the procedure according to Example 4 and structured. After developing upon etching uneven attack of the copper foil of the printed circuit board material by the etching solution was found.

The problem could be partly overcome at least partly only after extending the developing time, using a stronger concentration of developing solution, increasing the developing temperature or with a combination of these measures. However the etching result was still unsatisfactory even after these modifications, since the etching solution could not corrode the copper with problems. Further it was realized that the copper surfaces in the resist channels were partly passivated by the more intense corrosion of the developing solution with the result that the copper surfaces wee even harder to etch.

From these Comparative Examples it is seen that the application of the resists to the copper surfaces on printed circuit boards and subsequent satisfactory copper etching are only possible if the claimed compositions are used. Any departure from the compositions as claimed, e.g. by departing from the claimed combination of components or by departing from the claimed mole fractions of the claimed components will in any case lead to unsatisfactory results.

TABLE 5

(Compositions given in [mole %])

| Polymer | 1. Comp.(A) | 2. Comp.(C) | 3. Comp.(C) | 4. Comp.(D) | 5. Comp.(E) | $T_g$ [° C.] | $M_n$ [g/mol] | $M_w$ [g/mol] | PI |
|---|---|---|---|---|---|---|---|---|---|
| MB38 | 17.6(AA) | 21.4(TBMA) | | 61.0(MMA) | | 121.3 | 29,500 | 78,300 | 2.6 |
| MB29 | 17.6(MAA) | 21.4(TBA) | | 61.0(MMA) | | 126.1 | 26,900 | 61,200 | 2.3 |
| MB32 | 17.6(MAA) | 26.4(TBA) | | 56.0(MMA) | | 121.2 | 21,600 | 53,500 | 2.5 |
| MB47 | 27.6(MAA) | 21.4(TBMA) | | | 51.0(BA) | | 14,700 | 43,300 | 2.9 |
| MB31 | 17.6(MAA) | 36.65 (TBMA) | | | 45.75(BMA) | 110.0 | 37,700 | 83,300 | 2.2 |
| MB30 | 17.6(MAA) | 21.4(TBMA) | | | 61(BMA) | 97 | 34,300 | 71,900 | 2.1 |
| MB42 | 22.6(MAA) | 21.4(TBMA) | | | 56.0(BMA) | 109.0 | 38,900 | 85,600 | 2.2 |
| A-1 | 14.9(MAA) | 45.1(TBMA) | | | 40.0(BA) | | | | |
| A-2 | 12.7(MAA) | 35.0(TBMA) | | 17.5(MMA) | 34.8(2-EHA) | | | | |

TABLE 5-continued (Compositions given in [mole %])

| | | | | | |
|---|---|---|---|---|---|
| A-3 | 25.7(AA) | 57.3(TBMA) | | 17.0(2-EHA) | |
| A-4 | 7.1(MAA) | 23.2(TBMA) | 29.1(MMA) | 40.5 (BA + EA) | |

| | A | B | C | D | E |
|---|---|---|---|---|---|
| A-1 | 14.9(MAA) | 45.1(TBMA) | | | 40.0(BA) |
| A-2 | 12.7(MAA) | 35.0(TBMA) | | 17.5(MMA) | 34.8(2-EHA) |
| A-3 | 25.7(AA) | 57.3(TBMA) | | | 17.0(2-EHA) |
| A-4 | 7.1(MAA) | 23.2(TBMA) | | 29.1(MMA) | 40.5(BA + EA) |
| Claim 1 | 8–20 | 19–70 | 1–30 | | |
| Claim 2 | 8–20 | 19–70 | 1–30 | 10–60 | |
| Claim 3 | 8–20 | 19–70 | 1–30 | 10–60 | 3–35 |
| Claim 4 | 10–25 | 17–40 | | 20–60 | 1–35 |
| Claim 5 | 14–20 | 20–32 | | 30–50 | 10–40 |
| Claim 7 | 13–5 | 22.5–30 | | 50–65 | |

We claim:

1. A photosensitive composition, which can be converted by exposure in developing solutions from an insoluble to a soluble state, containing I—at least one photo acid generator and
   II—polymers which are formed from the following fractions of monomers, relative to the polymer:
   A-monomers selected from the group consisting of acrylic acid and methacrylic acid with a fraction of 8% by mol to 20% by mol,
   B-monomers selected from the group consisting of tert-butylacrylate and tert-butylmethacrylate with a fraction of 19% by mol to 70% by mol, and
   C-monomers selected from the group consisting of hydroxyethylmethacrylate, hydroxypropylmethacrylate, hydroxyphenylmethacrylate, hydroxyethylacrylate, hydroxypropylacrylate and hydroxyphenylacrylate with a fraction of 1% by mol to 30% by mol,
   D-additional monomers selected from the group consisting of methylacrylate and methylmethacrylate with a fraction of 10% by mol to 60% by mol,
   E-additional monomers selected from the group consisting of compounds with the general formula

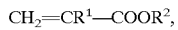
   $CH_2=CR^1-COOR^2$, where
   $R^1$ is a hydrogen atom or a methyl group and $R^2$ is a linear or branched alkyl group with at least three carbon atoms, with a fraction of 3% by mol to 35% by mol.

2. A photosensitive composition, which can be converted by exposure in developing solutions from an insoluble to a soluble state, containing I—at least one photo acid generator and
   II—polymers which are formed from the following fractions of monomers, relative to the polymers
   A-monomers selected from the group consisting of acrylic acid and methacrylic acid, with a fraction of 10% by mol to 25% by mol,
   B-monomers selected from the group consisting of tert-butylacrylate and tert-butylmethacrylate with a fraction of 17% by mol to 40% by mol,
   D-monomers, selected from the group consisting of methylacrylate and methylmethacrylate with a fraction of 20% by mol to 60% by mol, and
   E-monomers selected from the group consisting of compounds with the general formula

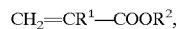
   $CH_2=CR^1-COOR^2$, where
   $R^1$ is a hydrogen atom or a methyl group and $R^2$ is a linear or branched alkyl group with at least five carbon atoms with a fraction of 1% by mol to 35% by mol, wherein the E-monomers are not identical to the B-monomers.

3. A photosensitive composition, which can be converted by exposure in developing solutions from an insoluble to a soluble state, containing I—at least one photo acid generator and
   II—polymers which are formed from the following fractions of monomers relative to the polymer
   A-monomers selected from the group consisting of acrylic acid and methacrylic acid, with a fraction of 14% by mol to 20% by mol,
   B-monomers selected from the group consisting of tert-butylacrylate and tert-butylmethacrylate with a fraction of 20% by mol to 32% by mol,
   D-monomers, selected from the group consisting of methylacrylate and methylmethacrylate with a fraction of 30% by mol to 50% by mol, and
   E-monomers selected from the group consisting of compounds with the general formula

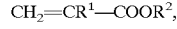
   $CH_2=CR^1-COOR^2$, where
   $R^1$ is a hydrogen atom or a methyl group and $R^2$ is a linear or branched alkyl group With at least five carbon atoms with a fraction of 10% by mol to 40% by mol., wherein the E-monomers are not identical to the B-monomers.

4. A photosensitive composition according to any one of claims 1–3 characterized by an average molecular weight Mw of the polymers from 30,000 to 90,000 and with a polymolecularity index PI of 1.6 to 3.1.

5. A photosensitive composition according to claim 4, characterized by an average molecular weight $M_w$ of the polymers from 35,000 to 82,000 and with a polymolecularity index PI of 2.1 to 3.0.

6. A photosensitive composition according to one of claims 1–3, characterized by a content of the photo acid generator from 1% by weight to 25% by weight relative to the weight of the polymer in the composition.

7. A photosensitive composition according to claim 6, characterized by a content of the photo acid generator from 2% by weight to 20% by weight relative to the weight of the polymer in the composition.

8. A photosensitive composition according to one of claims 1–3, characterized by one or several additionally included photo-sensitizers.

9. A photosensitive composition according to one of claims 1–3, characterized by a content of photosensitizers from 1% by weight to 6% by weight by weight, relative to the weight of the polymer in the composition.

10. A photosensitive composition according claim 9, characterized by a content of photosensitizers from 2% by weight to 4% by weight, relative to the weight of the polymer in the composition.

* * * * *